(12) United States Patent
Makar et al.

(10) Patent No.: US 8,301,947 B1
(45) Date of Patent: Oct. 30, 2012

(54) DYNAMIC SCAN CHAIN GROUPING

(75) Inventors: Samy Makar, Fremont, CA (US);
Anuja Banerjee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/285,316

(22) Filed: Oct. 31, 2011

(51) Int. Cl.
*G01R 31/28* (2006.01)
(52) U.S. Cl. ........................................ 714/729; 714/727
(58) Field of Classification Search ............. 324/726.02; 714/726, 728, 724, 729, 727
See application file for complete search history.

(56) References Cited

U.S. PATENT DOCUMENTS

| | | | |
|---|---|---|---|
| 4,872,169 A * | 10/1989 | Whetsel, Jr. | 714/727 |
| 5,592,493 A | 1/1997 | Crouch | |
| 6,615,380 B1 | 9/2003 | Kapur | |
| 6,646,460 B2 * | 11/2003 | Whetsel | 324/762.02 |
| 6,973,631 B2 | 12/2005 | Huang | |
| 7,120,843 B2 * | 10/2006 | Whetsel | 714/726 |
| 7,216,274 B2 * | 5/2007 | Jaber et al. | 714/726 |
| 7,900,105 B2 | 3/2011 | Kapur | |
| 7,945,834 B2 | 5/2011 | Waayers | |
| 2011/0099442 A1 * | 4/2011 | Hales et al. | 714/729 |
| 2012/0030532 A1 * | 2/2012 | Jain et al. | 714/726 |

* cited by examiner

*Primary Examiner* — David Ton
(74) *Attorney, Agent, or Firm* — Lawrence J. Merkel; Meyertons, Hood, Kivlin, Kowert & Goetzel, P.C.; Erik A. Heter

(57) ABSTRACT

A method and apparatus for dynamic scan chain grouping is disclosed. In one embodiment, an integrated circuit (IC) includes a number of scan partitions. Each scan partition includes a number of scan input ports and a number of corresponding scan output ports. Each scan input port and each scan output port includes a number of scan paths. Additionally, each scan partition includes a number of scan chains. Each scan partition is programmable to couple the scan paths of one of the scan input ports to each of the scan chains. Similarly, the corresponding output port may also be coupled to the scan chains. The scan paths of the remaining scan input ports may be selected to bypass the scan chains of the scan partition, having their respective scan input ports connected directly to their respective scan output ports. Each scan partition may be reconfigurable.

25 Claims, 8 Drawing Sheets

DYNAMIC SCAN CHAIN GROUPING

BACKGROUND

1. Field of the Invention

This invention relates to integrated circuits, and more particularly, to built-in mechanisms for testing integrated circuits.

2. Description of the Related Art

Circuitry to support scan testing may provide internal access to an integrated circuit (IC). Scan circuitry may be implemented by forming chains of scannable elements. Data may be serially shifted through the scannable elements of the scan chain. This may allow for the input of test stimulus data, as well as the capture and shifting out of test result data. Using available scan circuitry, manufacturing tests may be conducted on ICs prior to their shipment to a customer in order to verify the circuitry therein. Scan circuitry may also support hardware debugging during the development phase of an IC, providing information for future revisions thereof.

In order to perform a scan test, test stimulus data may be shifted into a scan chain. Once each bit has reached its target scan element, the test stimulus data may be applied to circuitry in the IC, and a clock signal may be pulsed. After the pulsing of the clock signal, test result data may be captured and shifted from the IC (e.g., into a test system) for further analysis. Multiple tests may be conducted for a given scan chain using different test vectors. Furthermore, many IC's include multiple scan chains. Each of the multiple scan chains in an IC may be separate an independent from one another. Thus, multiple tests may be conducted on each of the multiple scan chains in an IC.

SUMMARY

A method and apparatus for dynamic scan chain grouping is disclosed. In one embodiment, an integrated circuit (IC) includes a number of scan partitions. Each scan partition includes a number of scan input ports and a number of corresponding scan output ports. Each scan input port and each scan output port includes a number of scan paths. Additionally, each scan partition includes a number of scan chains (one or more). Each scan partition is programmable to couple the scan paths of one of the scan input ports to each of the scan chains. Similarly, the corresponding output port may also be coupled to the scan chains. The scan paths of the remaining scan input ports may be selected to bypass the scan chains of the scan partition, having their respective scan input ports connected directly to their respective scan output ports. Each scan partition may be dynamically reconfigurable.

In one embodiment, each scan partition includes an input selection circuit coupled to each input port. A scan control unit of the IC may convey a number of scan selection bits to the selection circuit of each partition in order to cause one of the respective scan input ports to be coupled to the respective scan chains. A number of output selection circuits, one each for each of the scan input port/output port combinations is also included. Each of the output selection circuits may receive one of the scan selection bits conveyed by the scan control unit. Each of the output selection circuits includes two inputs—a first input coupled to its corresponding scan input port, and another input coupled to the scan chains of that partition. For each of the scan input ports that is to be bypassed (i.e. not coupled to the scan chains), an output selection circuit may select the scan input port to be coupled directly to its corresponding output port. For the scan input port that is coupled to the scan chains, the corresponding output selection circuit may select its respective input coupled to the scan chains.

The reconfigurability of the scan partition may provide flexibility in conducing scan tests of the IC. For example, in one configuration, two scan partitions may be coupled in such a manner to produce long, serially coupled scan chains. In another configuration, data may be concurrently (e.g., in parallel) shifted into the scan chains through different ports of each two or more scan partitions. Furthermore, tests may be conducted in parallel for two or more different scan partitions.

BRIEF DESCRIPTION OF THE DRAWINGS

The following detailed description makes reference to the accompanying drawings, which are now briefly described.

Figure 1:
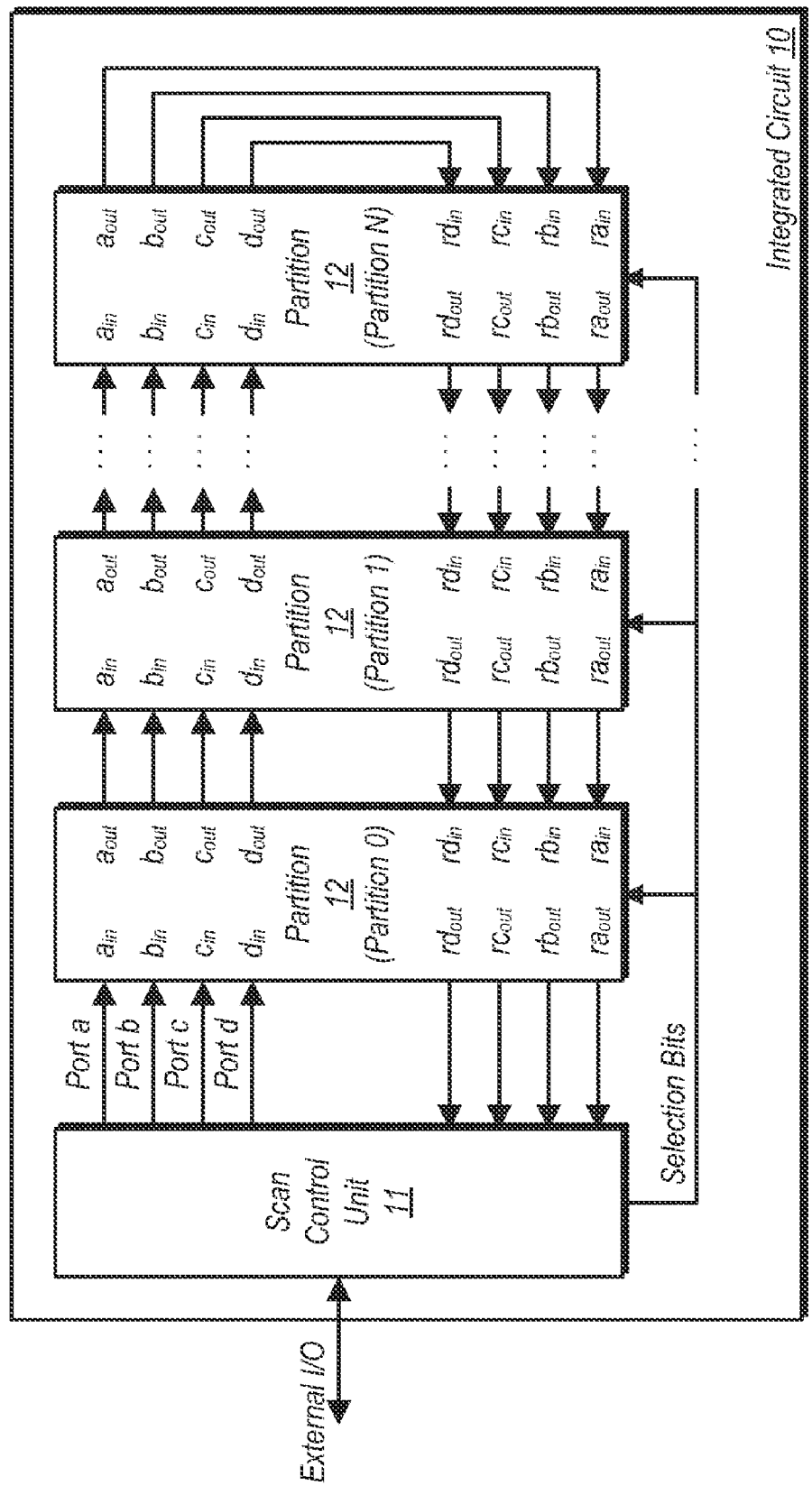
FIG. 1 is a block diagram of one embodiment of an integrated circuit (IC) having a plurality of scan partitions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with Scan Partitions:

Turning now to FIG. 1, a block diagram of one embodiment of an integrated circuit (IC) having a plurality of scan partitions is illustrated. In the embodiment shown, IC 10 includes a scan control unit 11 and a number of scan partitions 12. The number of partitions 12 included may vary from one embodiment to another, although it may be any integer value. Although not explicitly shown in this block diagram, IC 10 also includes various functional units and logic circuitry configured to perform its intended function(s).

In this particular embodiment, each of the partitions 12 includes four scan input ports, ports a-d. The actual number of ports (both input and output) in a given embodiment may be greater or lesser than the four ports shown in this example. Each scan input port may include one or more scan paths that can be coupled to one or more corresponding scan chains in each of the partitions 12. Each partition 12 in the embodiment shown also includes four output ports, ports a-d, each of which corresponds to one of the input ports (e.g., scan input port a corresponds to scan output port a, and so forth). Each of the scan input ports and scan output ports may include one or more scan paths that correspond to one or more scan chains within their respective ones of partitions 12.

The input ports of a first one of partitions 12 is coupled to receive data (e.g., scan input data, or test vectors) directly from scan control unit 11. The input ports of each of the remaining partitions 12 is coupled to receive data via corresponding output ports of a previous partition 12. For example, input ports $a_{in}$-$d_{in}$ of the second partition 12 (Partition 1) are coupled to corresponding output ports $a_{out}$-$d_{out}$ of the first partition 12 (Partition 0). Accordingly, scan data may be passed from one partition 12 to the next.

A final partition 12 in the embodiment shown (Partition N) has output ports that are coupled to return path input ports $ra_{in}$-$rd_{in}$. Each of partitions 12 includes return paths corresponding to each of the scan input port/scan output port combinations. Each partition 12 in the embodiment shown also includes corresponding return path output ports, $ra_{out}$-$rd_{out}$. The return paths of each partition 12 are connected to one another in a manner similar to that of the scan input ports and scan output ports, although the data flow is in the opposite direction. The return paths may be used to convey test result data obtained from scan tests back into scan control unit 12, where it may be analyzed and/or output to an interface external to IC 10 (e.g., to a test system).

As noted, each of the partitions 12 may include one or more scan chains to which one of the input ports and a corresponding one of the output ports may be connected to for performing scan operations. Corresponding input and output ports that are not connected to the scan chains in a given partition 12 may be connected to one another to form a bypass path. In general, each partition 12 in the embodiment shown may have one input port and a corresponding output port coupled to scan chains internal to the partitions, with the remaining input/output port combinations coupled to one another to form bypass paths.

The configuration of a particular partition 12 may be determined by selection bits conveyed from scan control unit 11. Each of partitions 12 is coupled to receive selection bits from scan control unit 11 in order to couple a corresponding input-output port pair to internal scan chains and to form bypass paths for the remaining input-output port pairs. The selection bits received by each of partitions 12 may be unique with respect to each of the other scan partitions. For example, scan control unit 11 may program a first partition 12, to couple its input port $a_{in}$ and output port $a_{out}$ to its respective scan chains. A second partition may be programmed by scan control unit 11 to couple its input port $b_{in}$ and output port $b_{out}$ to its respective scan chains. In general (and as will be discussed in further detail below) scan control unit 11 may program the various partitions 12 in any desired combination depending in order to form corresponding scan chain configurations. These configurations may be changed from one test to the next. For example, scan control unit 12 may program the various partitions 12 in a first configuration for a first test, and in a second configuration for a subsequent second test.

When two different partitions 12 have different input-output port combinations coupled to their respective scan chains, scan control unit 11 may input scan data in parallel. Thus, using the example given in the previous paragraph, scan control unit 11 may input test vectors to the first and second partitions 12 concurrently/in parallel. Furthermore, tests in the first and second partitions 12 may be conducted in parallel.

In addition to programming the various partitions 12 to configure various scan paths, scan control unit 11 may perform other functions in some embodiments. For example, embodiments are possible and contemplated wherein scan control unit 11 performs at least some analysis of test result data (e.g., pass/fail determination) based on data received from a return path. A scan control unit 11 configured to generate at least some of the test vectors input into the various scan paths is also possible and contemplated. In general, scan control unit 11 may provide any additional scan control functionality that is desired along with the ability to program the partitions 12. It is also noted that in some embodiments, the functions provided by scan control unit 11 may be moved off-chip and thus be provided by an external source (e.g., by a test system). Accordingly, the embodiment shown herein that includes a scan control unit 11 as part of IC 10 is exemplary but is not intended to be limiting.

Figure 2:
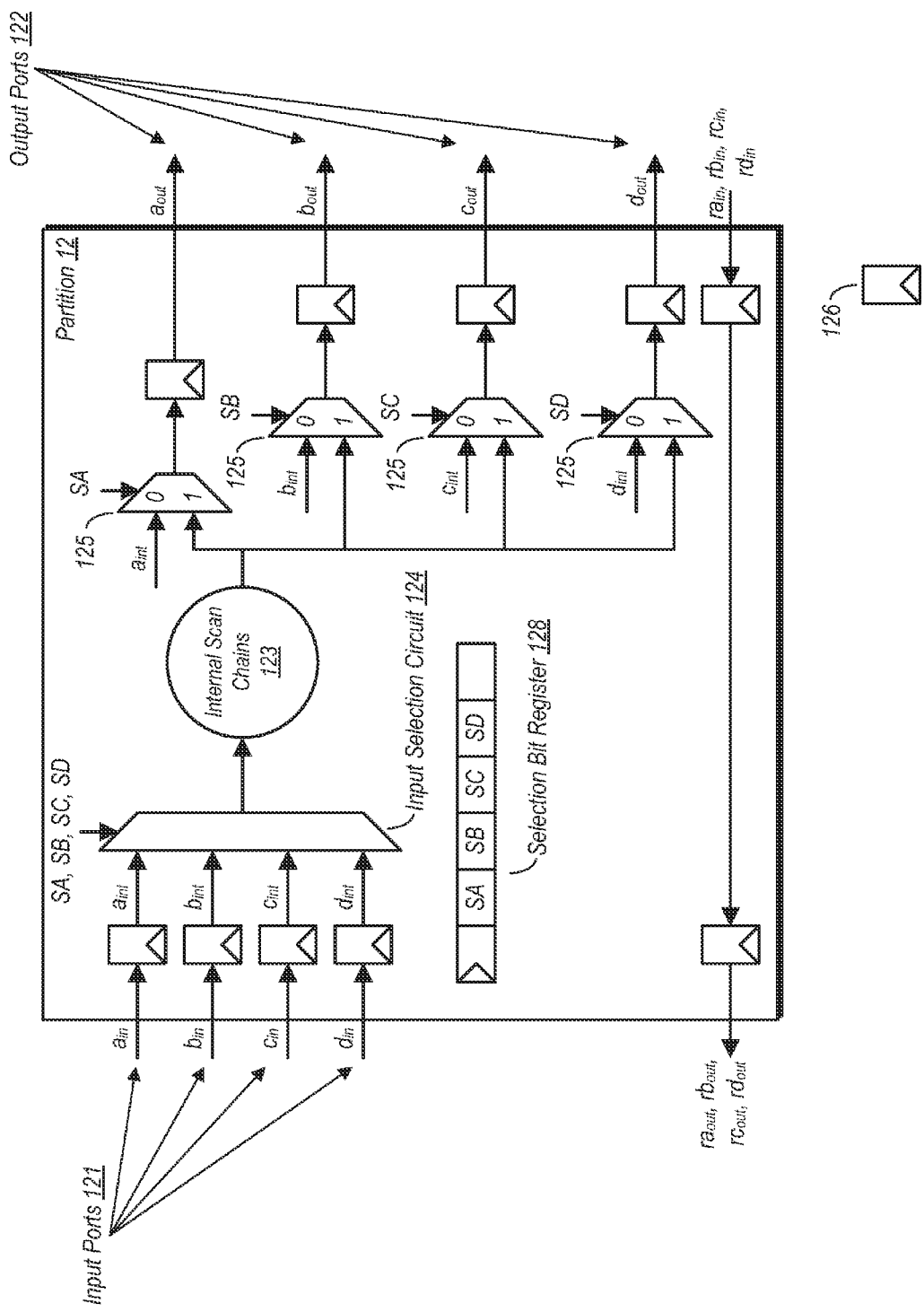
FIG. 2 is a block diagram illustrating one embodiment of a scan partition.

Scan Partition Embodiment and Scan Chains:

FIG. 2 is a drawing illustrating one embodiment of a scan partition 12. In the embodiment shown, partition 12 includes four scan input ports 221 ($a_{in}$-$d_{in}$) and four scan output ports 122 ($a_{out}$-$d_{out}$). Input ports 221 having the same letter designation as output ports 122 correspond to one another (e.g., $a_{in}$ corresponds to $a_{out}$). The number of input and output ports may vary from one embodiment to the next. Each of scan input ports 221 includes a number of registers 126 through which scan data may be received and temporarily stored before being shifted downstream. The output of each of these registers 126 that are associated with corresponding input ports 221 may effectively provide the logical endpoint of that input port (e.g., $a_{int}$ may provide the endpoint of input port $a_{in}$). Each of the scan output ports 122 also includes a number of registers 126 for the same purpose.

Each input port 221 and output port 122 may include a number of scan paths. For example, each input port 221 and each output port 122 may include sixteen scan paths in one particular embodiment. In general, the number of scan paths included in each of input ports 221 and output ports 122 may be as few as one or as many as desired for the particular implementation. The number of scan paths of each of the input ports 221 and output ports 122 may correspond to the number of internal scan chains 123 included in the partition 12. For example, if partition 12 includes sixteen internal scan chains, each of the input ports 221 and output ports 122 may include sixteen scan paths. Coupling a given one of input ports 221 and a given one of output ports 122 to internal scan chains 123 may thus couple a number of scan input paths and scan output paths to the scan chains, in a parallel configuration. Thus, scan data (test vectors or test result data) may be shifted in parallel through the scan paths of an input port 221, through the internal scan chains 123, and output from partition 12 through the corresponding scan paths of the associated output port 122.

It is noted that the number of scan elements, and thus the length of the scan chains, is not necessarily the same for each partition 12 of IC 10. For example, a first partition 12 may include internal scan chains having 10,000 scan elements each, while a second partition 12 may include internal scan chains having 1000 scan elements each. Furthermore, in embodiments where multiple scan chains are implemented within a given partition, it is possible that at least some of the scan chains may have a different number of scan elements than the other scan chains. For example, a given partition may have a first scan chain having 10,000 scan elements, a second scan chain having 9500 scan elements, and so on. The number of scan elements in any given scan chain may depend on a number of factors, including the amount of logic circuitry to be tested.

Scan partition 12 in the embodiment shown includes a number of different selection circuits. An input selection circuit 124 is coupled to each of the registers 126 associated with input ports 221. In a particular configuration, input selection circuit may select one of the input ports 221 to be coupled to the internal scan chains 123. More particularly, input selection circuit 124 may select the scan paths associated with an input port 221 to be coupled to corresponding ones of the internal scan chains 123.

Output selection circuits 225 in the embodiment shown each include two inputs, each of which includes a number of scan paths corresponding to the number of internal scan chains included in partition 12. A first of the inputs for each of output selection circuits 225 is the output of internal scan chains 123 (the '1' selection). A second of the inputs of each output selection circuit 225 is the output is the corresponding scan input port 221 (and more particularly, the output of registers 126 associated with the corresponding scan input port 221).

The programming of a particular configuration may be performed by scan control unit 11 by providing a number of selection bits to partition 12. In the embodiment shown, partition 12 includes selection bit register 128, which is configured to store one selection bit corresponding to each of the input/output port combinations. For example, selection bit SA corresponds to input port $a_{in}$ and output port $a_{out}$. The combination of selection bits received by each partition 12 may be different from one another, although it is also possible for selection circuit 11 to program each partition 12 to the same configuration. In general, selection circuit 11 may program the various partitions 12 to any possible configuration that is desired.

In programming a partition 12 in the embodiment shown, one input/output port combination may be coupled to the scan chains. The selection bit corresponding to the input/output port combination may be a logic '1' in this embodiment. The selected input port may be coupled through input selection circuit 124 to internal scan chains 123. Similarly, the corresponding selected output port may be coupled through its associated output selection circuit 225 to the internal scan chains 123.

The remaining input/output port combinations (i.e. those not coupled to internal scan chains 123) may be bypassed. In order to bypass an input/output port combination, the input port 221 of the combination is not selected by input selection circuit 124 but is selected by the corresponding output selection circuit 225. For example, if input port $a_{in}$ (and thus its endpoint $a_{int}$) is not selected by input selection circuit 124 but is selected by the corresponding output selection circuit 225, then that input port is effectively bypassed through partition 12. As used herein, the term 'bypass' may be defined as coupling scan paths associated with a particular input/output port combination such that those scan paths exclude the scan chains of the partition. Thus, when a particular input/output port combination is bypassed, the input port is effectively coupled to its corresponding output port with no intervening scan chains.

It is noted that in some embodiments, scan control unit 11 may program a partition 12 in a certain configuration in which all of the input/output port combinations are bypassed (e.g., by setting all of the selection bits to a logic '0'). Such a configuration may be useful if it is desired to conduct a test of circuitry associated with some, but not all partitions. It is also noted that the configuration of a particular partition 12 is dynamic and may thus be changed at any time by scan control unit 11 sending a new set of selection bits to selection bit register 128.

Partition 12 in the embodiment shown also includes return paths corresponding to each of the ports. Although only a return signal path is shown here, it is to be understood that signal paths are provided for each of the ports (and thus each scan path of a given port). A return path may be provided for each input/output port combination. For example, return input port $ra_{in}$ and return output port $ra_{out}$ correspond to input port $a_{in}$, and output port $a_{out}$, respectively. Each of the return paths includes corresponding registers 126 for providing temporary storage of shifted data. The return paths may be used to shift test result data from the scan chains to scan control unit 11.

Figure 3:
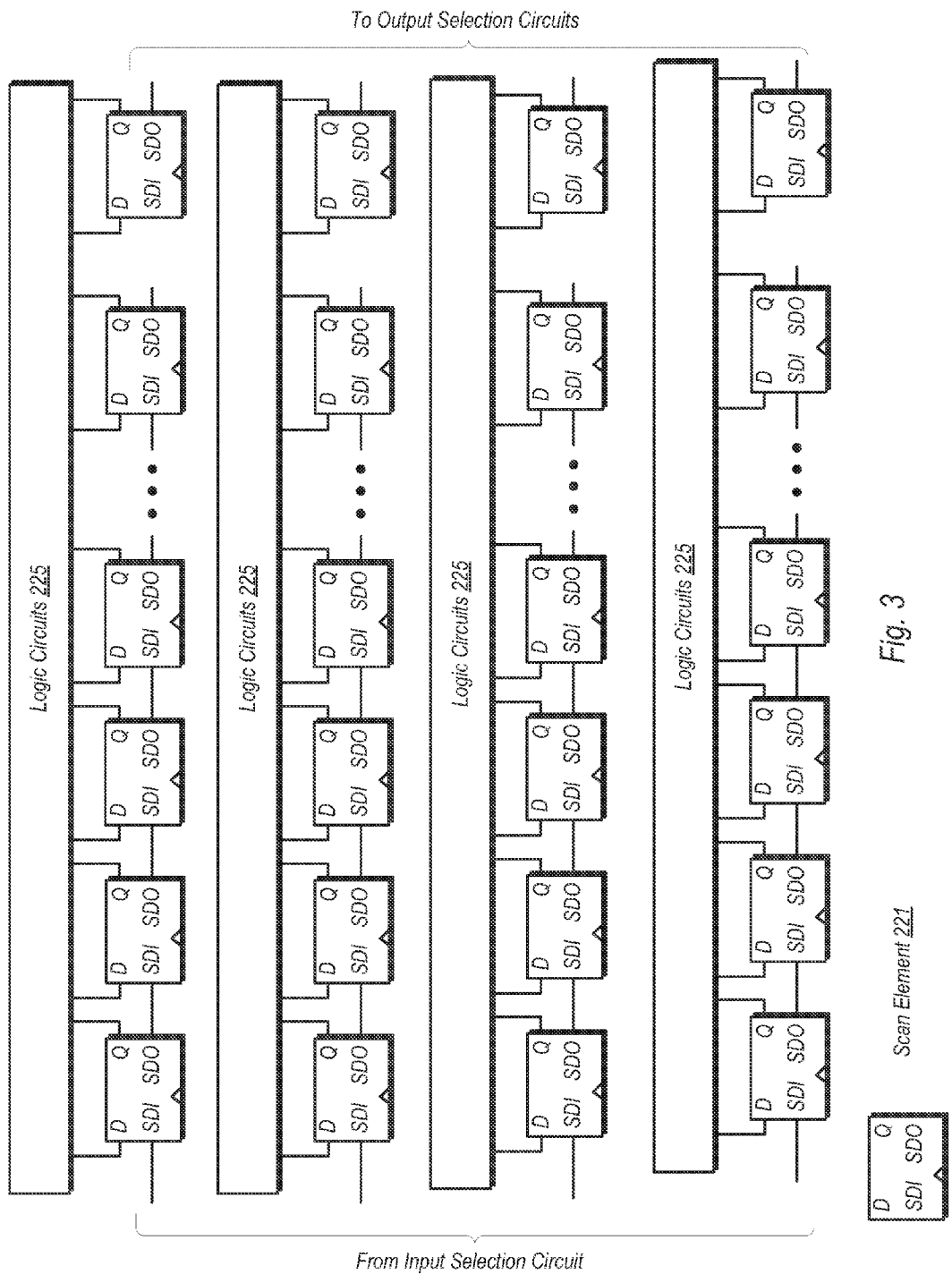
FIG. 3 is a diagram illustrating the exemplary scan chains coupled to logic of one embodiment of an IC.

FIG. 3 illustrates the arrangement of internal scan chains 123 for one embodiment of a scan partition 12. Each scan chain in the example shown includes a number of serially-coupled scan elements 221. Some of the scan elements 221 may be coupled to an input selection circuit 124 of the partition 12 in which they are implemented. Other ones of the scan elements may be coupled to output selection circuits of the respective partition 12. The remaining scan elements 221 are serially-coupled in between, as shown. Each scan element 221 includes a scan data input ('SDI') in which scan data may be shifted into the element. Each scan element 221 also includes a scan data output ('SDO') from which scan data may be shifted from the scan element. Thus, scan data (either test vector being input to or test result data being shifted from the scan chain) may be shifted through each scan chain from one scan element 221 to the next. The shifting of scan data may be synchronized to one or more clock signals. In one embodiment, scan elements 221 may include scan elements of a level-sensitive scan design (LSSD) scan element coupled to receive two separate scan clocks (connections not shown here) to which shifting is synchronized to during scan shifting. In another embodiment, scan elements 221 may include scan elements that are of a multiplexer-D ('Mux-D') scan design, to which shifting may be synchronized to a single clock signal. Shifting operations may be controlled at least in part by scan control unit 11.

Each scan element 221 in the embodiment shown is coupled to a corresponding block of logic circuits 225. The organization of logic circuits 225 may vary from one embodiment to the next, and is shown here in block form for the sake of simplicity. Logic circuits 225 may include both combinational and sequential logic circuits. In addition to their use in scan testing and scan shifting operations, each scan element 221 may provide temporary storage for data during the normal operation of IC 10. Data output from one of logic circuits 225 may be received by a scan element 221 via its respective 'D' input. Data may be output to one of logic circuits 224 from a scan element 221 via its respective 'Q' output.

During scan testing, test vectors shifted into a scan chain may be applied to various logic circuits 225 from the 'Q' outputs of respectively coupled scan elements 221. A clock signal received by logic circuits 221 may be pulsed to produce test result data. After the test is completed, respectively coupled scan elements 221 may capture the test result data on the 'D' inputs of respectively coupled scan elements 221. Once test result data has been captured into the scan elements 221, it may be shifted from the scan chain in serial manner. In accordance with the embodiment of partition 12 shown above, shifting test result data from a scan chain back into scan control unit 11 may include shifting the data through a return path.

Figure 4:
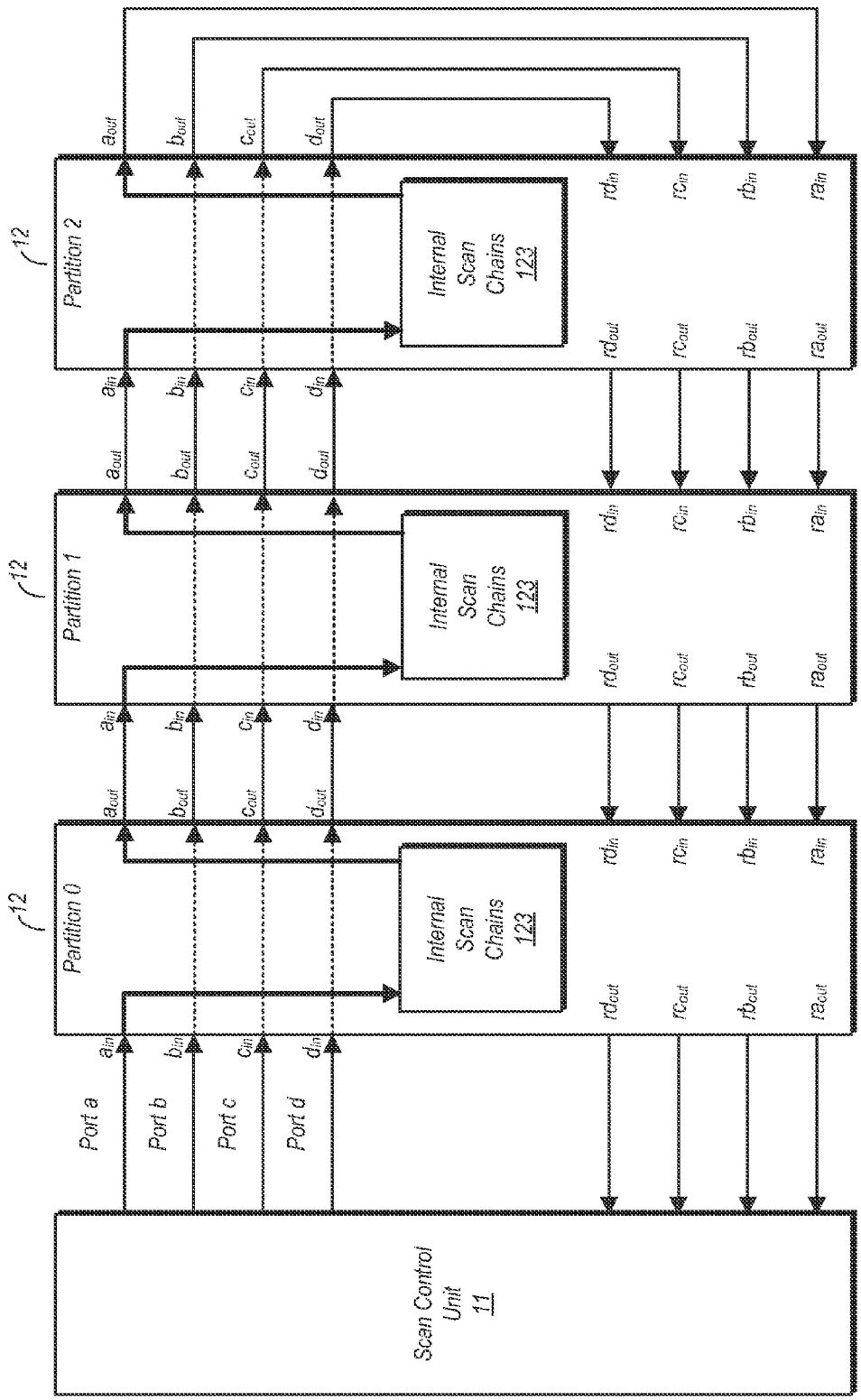
FIG. 4 is a block diagram illustrating a first configuration of scan partitions in one embodiment of an IC.
Figure 5:
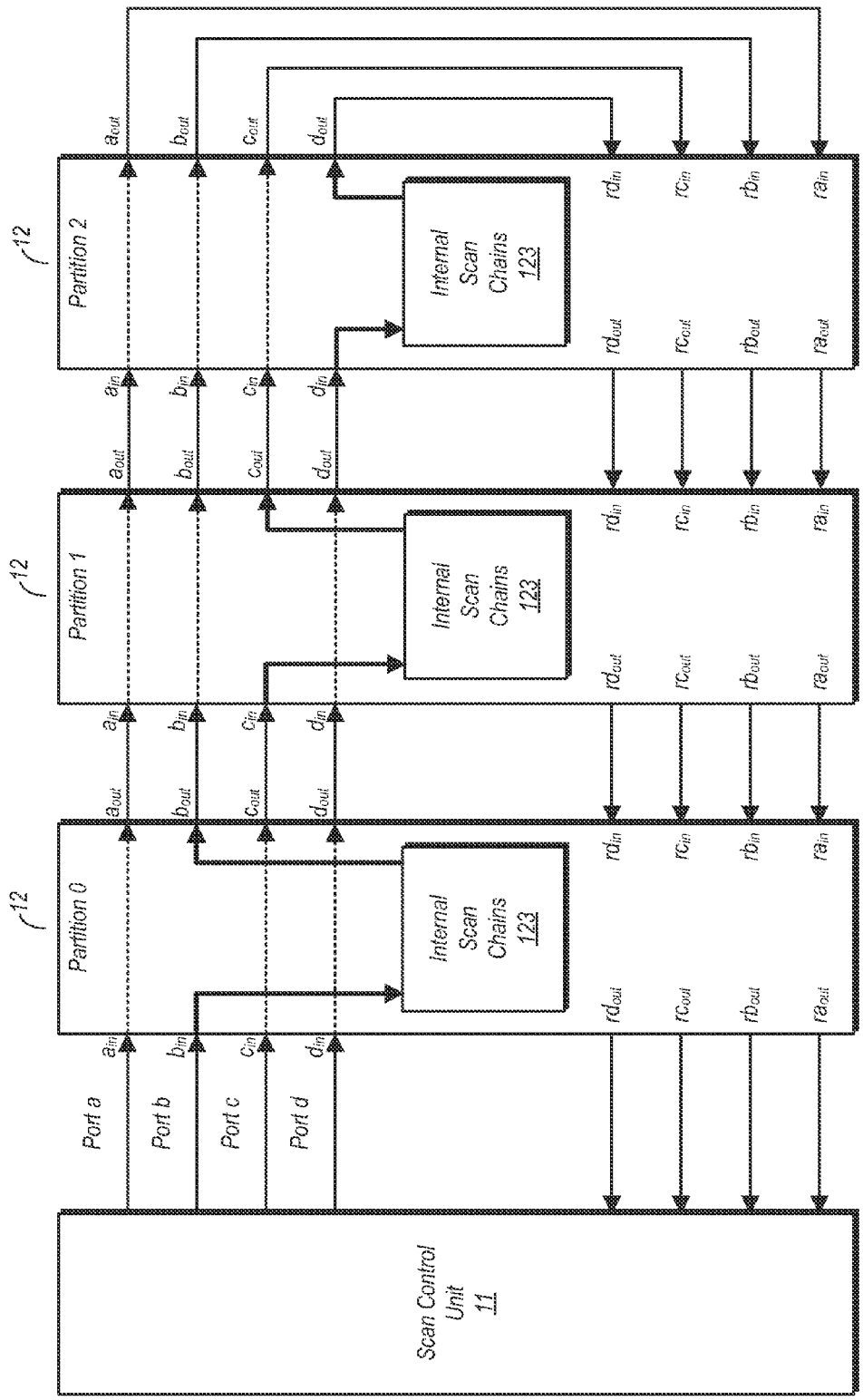
FIG. 5 is a block diagram illustrating a second configuration of scan partitions in one embodiment of an IC.
Figure 6:
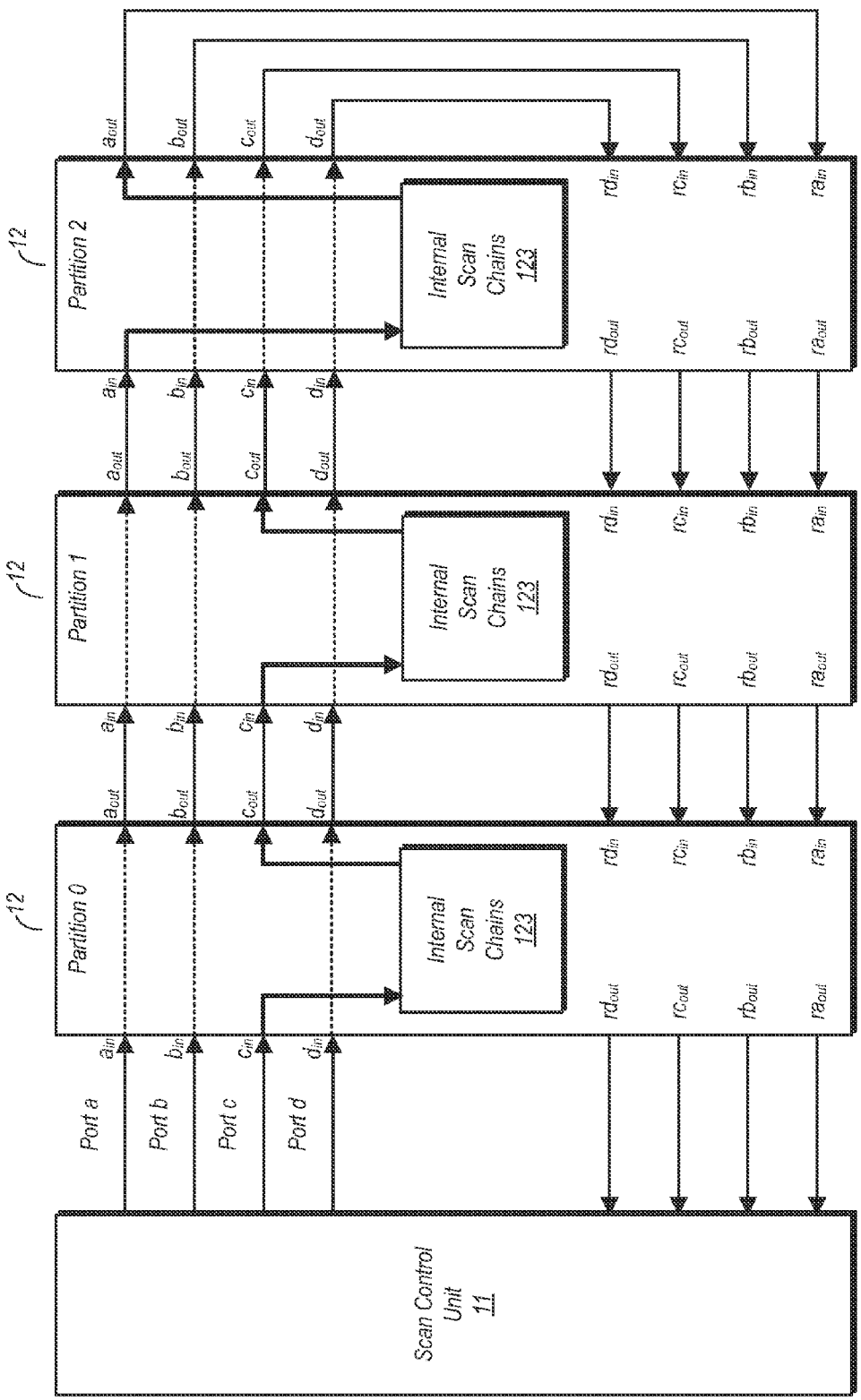
FIG. 6 is a block diagram illustrating a third configuration of scan partitions in one embodiment of an IC.

Dynamic Scan Reconfiguration Examples:

FIGS. 4-6 are examples used to illustrate the reconfigurability of scan paths through IC 10 by configuring the partitions 12. In accordance with the above, the configuration of each partition 12 may be programmed by scan control unit 11. More particularly, each partition 12 may be configured in accordance with a set of scan selection bits provided by scan control unit 11. Any of the particular configurations to which a scan partition 12 is programmed may be changed by changing the state of the selection bits. Similarly, the overall configuration of the scan paths in accordance with the programming of the individual partitions 12 may also be changed by changing the configuration of one or more partitions. The reconfigurability of the overall scan paths may provide a significant amount of flexibility for devising and performing scan tests of IC 10. Thus, a first test (or set of tests) may be performed with the scan paths in a first configuration, and a subsequent second test (or set of tests) may be performed with the scan paths in a second configuration.

The examples shown in FIGS. 4-6 are directed to an exemplary embodiment having three partitions 12, each of which includes four input/output port combinations. However, various embodiments may include any suitable number of partitions 12 having any suitable number of input/port combinations. Furthermore, such embodiments may be configured in any manner enabled by the number of partitions and number of input/output port combinations. It is noted for the purposes of discussion of the examples of FIGS. 4-6, a given input/output port combination is referred to as a port. Thus, the input/output port combination of $a_{in}$ and $a_{out}$ is referred to here a 'Port A', and so forth. Furthermore, individual partitions may referred to as 'Partition 0', 'Partition 1', or 'Partition 2'.

In the example shown in FIG. 4, each of the partitions 12 is programmed such that port A of each partition 12 is coupled to its respective internal scan chains 123. Ports B, C, and D of each of partitions 12 are bypassed, i.e., not coupled to the respective internal scan chains 123. In this configuration, the internal scan chains 123 of the partitions 12 are effectively coupled together in series. Thus, the configuration shown here effectively provides a single set of long scan chains extending through the scan testing space of IC 10. Accordingly, test vector data may be serially shifted into the internal scan chains 123. Similarly, test result data may be serially shifted from the internal scan chains 123 in the illustrated configuration.

In the example of FIG. 5, Port B is coupled to the internal scan chains 123 of Partition 0, while Ports A, C, and D are bypassed. In Partition 1, Port C is coupled to internal scan chains 123, while Ports A, B, and D are bypassed. In Partition 2, Port D is coupled to internal scan chains 123, while Ports A, B, and C are bypassed. In this configuration, the internal scan chains 123 of Partitions 0, 1, and 2 are effectively separate and independent from one another. In this configuration, scan control unit 11 may input test vectors into the respective sets of internal scan chains 123 in parallel (or concurrently). Furthermore, since the internal scan chains 123 of a given one of partitions 12 are independent from those of the other partitions, shifting data into or out of one set of scan chains need not be affected by shift operations performed (or not performed) in the others. Testing may be concurrently and independently conducted in each of the partitions 12 in this configuration based on respectively received sets of test vectors.

In FIG. 6, Port C is coupled to the internal scan chains 123 of Partitions 0 and 1. Ports A, B, and D are bypassed in Partitions 0 and 1. In Partition 2, Port A is coupled to the internal scan chains 123 while Ports B, C, and D are bypassed. Thus, scan chains spanning Partitions 0 and 1 are formed along with separate scan chains contained within Partition 2. The shifting of data in Partitions 0 and 1 are dependent on each other in this particular configuration. However, the shifting of data in Partition 2 is independent of that for Partitions 0 and 1, and vice versa. Thus, shifting operations may occur in Partition 2 concurrently with and independently of shifting operations occurring in Partitions 0 and 1. Furthermore, testing using the scan chains of Partition 2 may be conducted independently and/or concurrently with tests performed in Partitions 0 and 1.

The examples shown here illustrate only a few of the possible configurations of the embodiment shown. As noted above, the number of possible configurations for a given embodiment is limited only by the number of partitions 12 and the number of ports for each partition 12. Moreover, a corresponding scan control unit 11 may reconfigure the partitions 12 as necessary to provide any desired configuration for conducting scan testing.

Figure 7:
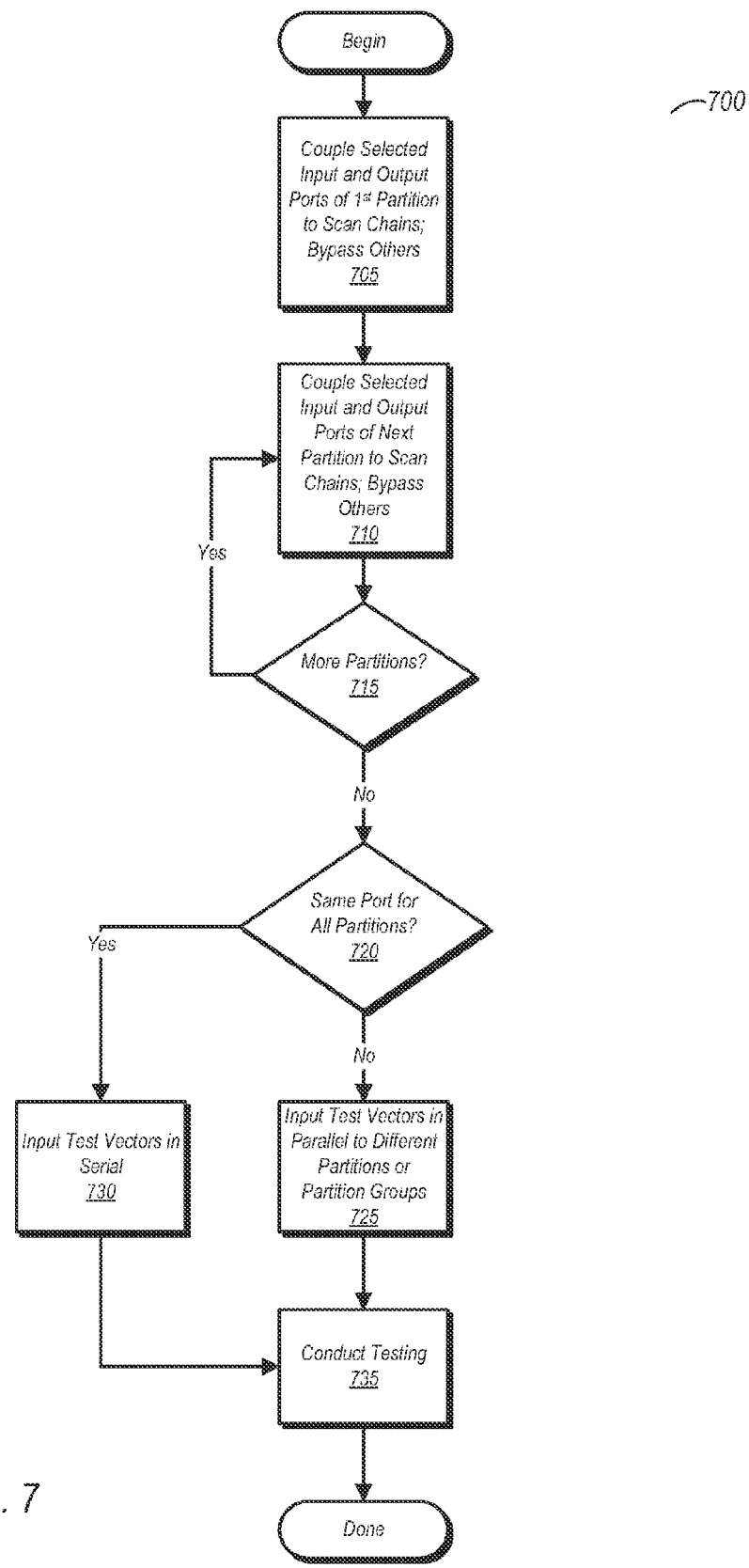
FIG. 7 is a flow diagram illustrating one embodiment of a method for dynamically configuring scan partitions.

Method Flow Diagram:

Turning now to FIG. 7, a flow diagram illustrating one embodiment of a method for configuring scan partitions in an IC to form a desired scan test topology. Method 700 also encompasses the inputting of test vectors and conducting scan tests. Method 700 as discussed herein is directed to embodiments having at least two scan partitions, but may be more generally applied to embodiments having a greater number of partitions as well. The partitions may be similar to (or the same as) the partitions 12 discussed above, or may be other embodiments not explicitly discussed herein.

Method 700 begins with the coupling of selected input and output ports of a first partition to internal scan chains while bypassing the other input and output ports (block 705). A second partition may also be configured by coupling selected ones of its respective input and output ports to its internal scan chains, while bypassing the remaining ports (block 710). If more partitions are to be configured (block 715, yes), then block 710 may be repeated as many times as necessary until all partitions are configured as desired. Once there are no more partitions to be configured (block 715, no), the configuration process is complete.

If the same port (i.e. same input/output port combination) is coupled to respective internal scan chains for each partition (block 720, yes), the scan configuration may effectively include a number of scan chains that extend across all of the partitions. In such a configuration, test vectors may be serially shifted into each of the scan chains (block 730). If the input/output port combinations coupled to respective scan chains are different for one or more of the partitions (block 720, no) then the scan configuration may include at least one set of scan chains that is effectively separate and independent from the others. A separate and independent scan chain may be defined for the purposes of this disclosure as one in which the shifting of scan data (inputting test vectors or outputting test result data) does not depend on shift operations being performed in other scan chains. In such a configuration, test vectors may be input in parallel (or concurrently) to the separate sets of scan chains. Similarly, testing may be conducted in parallel or concurrently for the separate sets of scan chains in such a configuration.

Regardless of the configuration, upon completing the inputting of test vectors, testing may be conducted (block 735). The testing may include the scan elements of the various scan chains applying the test vectors to the logic circuitry in the IC, providing at least one clock pulse, and capturing the test result data. Upon capture of the test result data, shifting operations may re-commence, as the test result data is shifted to the scan control unit for observation and analysis.

Figure 8:
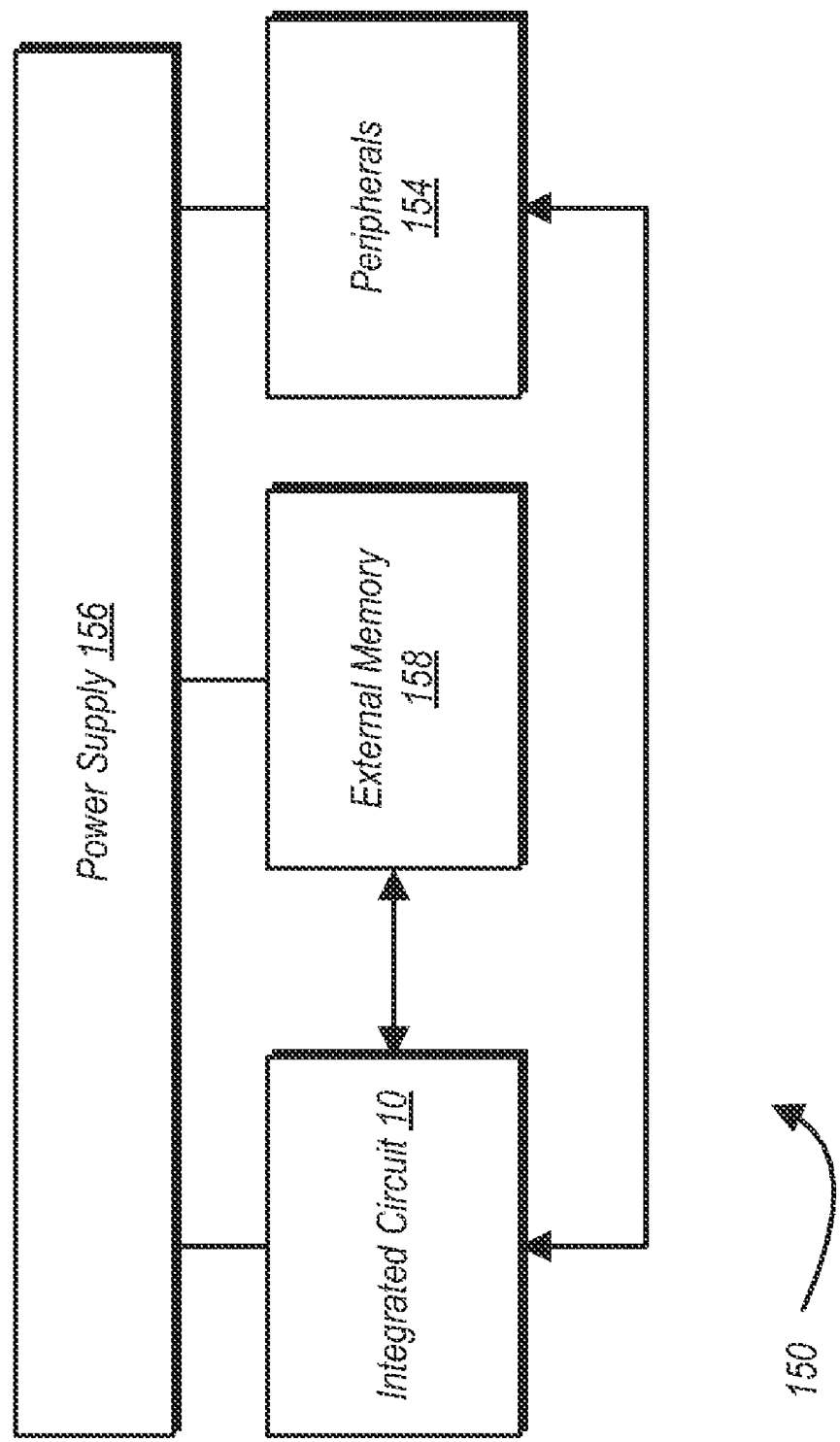
FIG. 8 is a block diagram of one embodiment of an exemplary system.

Exemplary System:

Turning next to FIG. 8, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a first scan test partition, wherein the first scan test partition includes:
a first plurality of input ports;
a first selection circuit coupled to each of the first plurality of input ports, wherein the first selection circuit is configured to select one of the first plurality of input ports based on states of a first plurality of selection signals;
a first plurality of scan chains coupled to an output of the first input selection circuit;
a first plurality of bypass circuits each coupled to the first plurality of scan chains and further coupled to corresponding ones of the first plurality of input ports, wherein each of the bypass circuits is configured to couple its corresponding input port to a corresponding one of a first plurality of output ports for which its corresponding input port is not selected by the selection circuit.

2. The integrated circuit as recited in claim 1, further comprising a second scan test partition including:
a second selection circuit coupled to each of the second plurality of input ports, wherein the second selection circuit is configured to select one of the first plurality of input ports based on states of a second plurality of selection signals;
a second plurality of scan chains coupled to an output of the second input selection circuit;
a second plurality of bypass circuits each coupled to the second plurality of scan chains and further coupled to corresponding ones of the second plurality of input ports, wherein each of the bypass circuits is configured to couple its corresponding input port to a corresponding one of a second plurality of output ports for which its corresponding input port is not selected by the selection circuit;
wherein each of the second plurality of input ports is coupled to a corresponding one of the first plurality of output ports.

3. The integrated circuit as recited in claim 2, further comprising a third scan test partition including:
a third selection circuit coupled to each of the third plurality of input ports, wherein the third selection circuit is configured to select one of the first plurality of input ports based on states of a third plurality of selection signals;
a third plurality of scan chains coupled to an output of the third input selection circuit;
a third plurality of bypass circuits each coupled to the third plurality of scan chains and further coupled to corresponding ones of the third plurality of input ports, wherein each of the bypass circuits is configured to couple its corresponding input port to a corresponding one of a third plurality of output ports for which its corresponding input port is not selected by the selection circuit;
wherein each of the third plurality of input ports is coupled to a corresponding one of the second plurality of output ports.

4. The integrated circuit as recited in claim 3, wherein each of the first, second, and third partitions include a plurality of return paths.

5. The integrated circuit as recited in claim 2, further comprising a scan control unit, wherein the scan control unit is configured to concurrently provide a first plurality of test vectors to the first plurality of scan chains and a second plurality of test vectors to the second plurality of scan chains.

6. A method comprising:
coupling a first one of a plurality of scan input ports of a first partition to one or more scan chains of the first partition;
coupling respective outputs of the one or more scan chains of the first partition to a first one of a plurality of scan output ports of the first partition; and
coupling remaining ones of the first plurality of scan input ports to a corresponding ones of the plurality of scan output ports of the first partition.

7. The method as recited in claim 6, further comprising:
coupling a first one of a plurality of scan input ports of a second partition to one or more scan chains of the second partition, wherein the first one of the second plurality of scan input ports is coupled to the first one of the first plurality of scan output ports; and coupling remaining ones of the second plurality of scan input ports to corresponding ones of a plurality of scan output ports of the second partition.

8. The method as recited in claim 7, further comprising:
a scan control unit providing a first plurality of selection bits to a selection circuit in the first partition and a second plurality of selection bits to a selection circuit in the second partition;
the first selection circuit selecting a scan input port of the first partition based on the first plurality of selection bits; and
the second selection circuit selecting a scan input port of the second partition based on the second plurality of selection bits.

9. The method as recited in claim 6, further comprising:
coupling a first one of a plurality of scan input ports of the second partition to a first one of a plurality of scan output ports of the second partition; and
coupling a second one of a plurality of scan input ports of the second partition to one or more scan chains of the second partition, wherein the second one of the plurality of scan input ports of the second partition is coupled to a second one of the plurality of scan output ports of the first partition.

10. The method as recited in claim 9, further comprising:
providing first test vectors to the one or more scan chains of the first partition through the first one of the plurality of scan input ports of the first partition;
providing second test vectors to the one or more scan chains of the second partition through the second one of the plurality of scan input ports of the second partition; and
concurrently conducting a scan test using the first test vectors and the second test vectors.

11. An integrated circuit comprising:
a plurality of scan partitions, wherein a first one of the plurality of scan partitions has a first plurality of scan input ports and a first plurality of scan output ports, and wherein a second one of the plurality of scan partitions has a second plurality of scan input ports and a second plurality of scan output ports, wherein the first plurality of scan output ports are coupled to the second plurality of scan input ports, and wherein the first scan partition is programmable to select a first scan input port of the first plurality of scan input ports to be coupled to a first plurality of scan chains within the first scan partition, and wherein the first partition is programmable to bypass a second scan input port of the first plurality of scan input ports to a corresponding one of the first plurality of scan output ports.

12. The integrated circuit as recited in claim 11, wherein the first scan partition is further programmable to select the first plurality of scan input ports to be coupled to bypass the first plurality of scan chains and further programmable to select the second plurality of scan input ports to be coupled to the first plurality of scan chains.

13. The integrated circuit as recited in claim 11, wherein each of the plurality of scan partitions is programmable to select one of a corresponding plurality of scan input ports to be coupled to a corresponding a plurality of scan chains.

14. The integrated circuit as recited in claim 13, wherein each of the plurality of scan partitions is programmable to cause one or more of the corresponding plurality of scan input ports to bypass the corresponding plurality of scan chains.

15. The integrated circuit as recited in claim 11, wherein the integrated circuit includes a scan control unit configured to program each of the plurality of scan partitions to select one of its corresponding scan input ports to be coupled to its corresponding plurality of scan chains and further configured to program each of the plurality of scan partitions to select its remaining scan input ports to bypass the corresponding plurality of scan chains.

16. A method comprising:
a scan control unit programming a first scan partition to select one of a first plurality of scan ports to be coupled to a first plurality of scan chains;
the scan control unit programming a first scan partition to select remaining ones of the first plurality of scan input ports to bypass the first plurality of scan chains;
the scan control unit programming a second scan partition to select one of a second plurality of scan input ports to be coupled to a second plurality of scan chains, wherein each of the second plurality of scan input ports is coupled to a corresponding one of a first plurality of scan output ports associated with the first scan partition; and
the scan control unit programming the second scan partition to select remaining ones of the second plurality of scan input ports to bypass the second plurality of scan chains.

17. The method as recited in claim 16, further comprising the scan control unit serially conveying a plurality of test vectors to the first and second plurality of scan chains through a first scan input port of each of the first and second scan partitions.

18. The method as recited in claim 16, further comprising the scan control unit concurrently conveying a first plurality of test vectors to the first scan partition and a second plurality of test vectors to the second partition.

19. The method as recited in claim 18, wherein concurrently conveying the first and second plurality of test vectors comprises:
coupling a first scan input port of the first scan partition to the first plurality of scan chains, wherein the first plurality of test vectors are conveyed through the first scan input port of the first scan partition;
coupling the first plurality of scan chains to a first scan output port of the first scan partition;
bypassing a second scan input port of the first scan partition by coupling a second scan input port of the first scan partition to a second scan output port of the first scan partition;
bypassing a first scan input port of the second scan partition, wherein the first scan input port of the second scan partition is coupled to the first scan output port of the first scan partition;
coupling a second scan input port of the second scan partition to the second plurality of scan chains, wherein the second scan input port of the second scan partition is coupled to a second scan output port of the first scan partition, and wherein the second plurality of test vectors is conveyed through the second scan input port of the second scan partition.

20. The method as recited in claim 16, further comprising the scan control unit programming the first and second scan partitions by providing first and second pluralities of selection bits, respectively, to the first and second scan partitions.

21. An integrated circuit comprising:
a first scan unit having first plurality of scan input ports, a first plurality of scan output ports, and a first plurality of scan chains;
a second scan unit having a second plurality of scan input ports, a second plurality of scan output ports, and a second plurality of scan chains, wherein each of the first plurality of scan output ports is coupled to a corresponding one of the second plurality of scan input ports; and a scan control unit configured to:

program the first scan unit to select one of the first plurality of scan input ports and a corresponding one of the first plurality of scan output ports to be coupled to the first plurality of scan chains and select remaining ones of the first plurality of scan input ports to be coupled to corresponding ones of the first plurality of scan output ports such that the first plurality of scan chains are bypassed; and program the second scan unit to select one of the second plurality of scan input ports and a corresponding one of the second plurality of scan output ports to be coupled to the second plurality of scan chains and select remaining ones of the second plurality of scan input ports to be coupled to corresponding ones of the second plurality of scan output ports such that the second plurality of scan chains are bypassed.

22. The integrated circuit as recited in claim 21, wherein the scan control unit is configured to program the first scan unit by providing a first plurality of selection bits to the first scan unit, and further configured to program the second scan unit by providing a second plurality of selection bits to the second scan unit.

23. The integrated circuit as recited in claim 22, wherein the first scan unit includes a first selection circuit coupled to receive each of the first plurality of selection bits, wherein the first selection circuit is coupled to select the one of the first plurality of scan input ports to be coupled to the first plurality of scan chains based on states of the first plurality of selection bits; and wherein the second scan unit includes a second selection circuit coupled to receive each of the second plurality of selection bits, wherein the second selection circuit is coupled to select the one of the second plurality of scan input ports to be coupled to the second plurality of scan chains based on states of the second plurality of selection bits.

24. The integrated circuit as recited in claim 22, wherein the first scan unit includes a first plurality of bypass circuits each coupled to receive a corresponding one of the first plurality of selection bits, wherein, based on states of the selection bits, one of the first plurality of bypass circuits is configured to coupled an output of the first plurality of scan chains to a one of the first plurality of output ports and remaining ones of the first plurality of output ports to corresponding ones of the first plurality of input ports.

25. The integrated circuit as recited in claim 24, wherein the second scan unit includes a second plurality of bypass circuits each coupled to receive a corresponding one of the second plurality of selection bits, wherein, based on states of the selection bits, one of the second plurality of bypass circuits is configured to coupled an output of the second plurality of scan chains to a one of the second plurality of output ports and remaining ones of the second plurality of output ports to corresponding ones of the second plurality of input ports.

* * * * *